(12) United States Patent
Nirschl et al.

(10) Patent No.: US 7,541,609 B2
(45) Date of Patent: Jun. 2, 2009

(54) PHASE CHANGE MEMORY CELL HAVING A SIDEWALL CONTACT

(75) Inventors: Thomas Nirschl, Essex Junction, VT (US); Mark Lamorey, South Burlington, VT (US)

(73) Assignees: International Business Machines Corporation, Armonk, NY (US); Qimonda North America Corp., Cary, NC (US)

( * ) Notice: Subject to any disclaimer, the term of this patent is extended or adjusted under 35 U.S.C. 154(b) by 341 days.

(21) Appl. No.: 11/601,304

(22) Filed: Nov. 17, 2006

(65) Prior Publication Data

US 2008/0116442 A1    May 22, 2008

(51) Int. Cl.
*H01L 29/68* (2006.01)
*G11C 11/00* (2006.01)
*H01L 21/02* (2006.01)

(52) U.S. Cl. ............ 257/4; 257/E21.002; 257/E45.002; 365/148; 29/25.03

(58) Field of Classification Search ............... 257/4, 257/2, E45.002, E29.17
See application file for complete search history.

(56) References Cited

U.S. PATENT DOCUMENTS

| | | | |
|---|---|---|---|
| 6,891,747 B2 | 5/2005 | Bez et al. | |
| 6,972,430 B2 | 12/2005 | Casagrande et al. | |
| 7,026,639 B2 | 4/2006 | Cho et al. | |
| 7,151,300 B2 * | 12/2006 | Chang | 257/379 |
| 2003/0219924 A1 | 11/2003 | Bez et al. | |
| 2006/0003515 A1 | 1/2006 | Chang | |
| 2006/0006374 A1 | 1/2006 | Chang | |

FOREIGN PATENT DOCUMENTS

KR   2004-76040    8/2004

OTHER PUBLICATIONS

Korean Office Action mailed Jul. 18, 2008.

* cited by examiner

*Primary Examiner*—Sue Purvis
*Assistant Examiner*—William Harriston
(74) *Attorney, Agent, or Firm*—Dicke, Billig & Czaja, PLLC

(57) ABSTRACT

A memory cell includes a first electrode and a second electrode forming an opening. The opening is defined by a first sidewall, a second sidewall, and a surface extending between the first sidewall and the second sidewall. The memory cell includes phase change material contacting the first electrode and the first sidewall and the second sidewall. The memory cell includes isolation material electrically isolating the phase change material from the surface extending between the first sidewall and the second sidewall.

25 Claims, 8 Drawing Sheets

PHASE CHANGE MEMORY CELL HAVING A SIDEWALL CONTACT

BACKGROUND

One type of memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself, or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell. To minimize the amount of power that is used to program each memory cell, the interface area between the phase change material and at least one electrode of the memory cell should be minimized.

For these and other reasons, there is a need for the present invention.

SUMMARY

One embodiment of the present invention provides a memory cell. The memory cell includes a first electrode and a second electrode forming an opening. The opening is defined by a first sidewall, a second sidewall, and a surface extending between the first sidewall and the second sidewall. The memory cell includes phase change material contacting the first electrode and the first sidewall and the second sidewall. The memory cell includes isolation material electrically isolating the phase change material from the surface extending between the first sidewall and the second sidewall.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
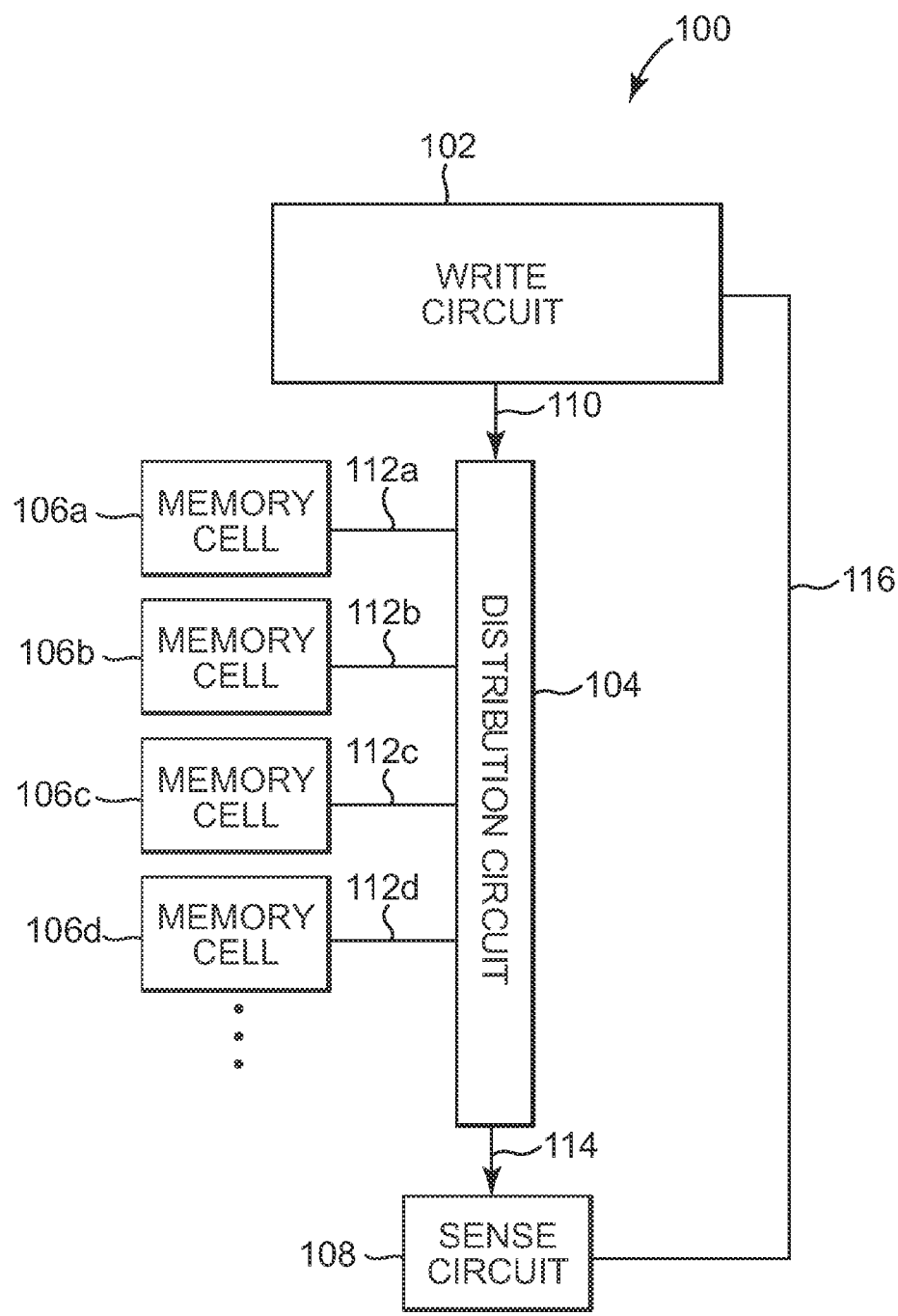
FIG. 1 is a block diagram illustrating one embodiment of a memory device.

FIG. 1 is a block diagram illustrating one embodiment of a memory device 100. Memory device 100 includes a write circuit 102, a distribution circuit 104, memory cells 106a, 106b, 106c, and 106d, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material, and hence the cell resistance, is controlled using a suitable write strategy.

Memory cells 106a-106d are fabricated to include a reduced interface area between the phase change material of each memory cell and at least one electrode of each memory cell by using lithography-independent etching. In addition, memory cells 106a-106d include thermal isolation to improve the programming characteristics of the memory cells. The reduced interface area and the thermal isolation improve scaling of the reset power used to program each memory cell.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to write circuit 102 through signal path 116.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a trinary system is used, wherein the three states are assigned bit values of "0", "1", and "2". In another embodiment, the two or more states includes four states that are assigned multi-bit values, such as "00", "01", "10", and "11". In other embodiments, the two or more states can be any suitable number of states in the phase change material of a memory cell.

In one embodiment, write circuit 102 provides voltage pulses to distribution circuit 104 through signal path 110, and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-106d. In other embodiments, write circuit 102 provides current pulses to distribution circuit 104 through signal path 110, and distribution circuit 104 controllably directs the current pulses to memory cells 106a-106d through signal paths 112a-112d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write circuit 102 provides voltage across one of the memory cells 106a-106d and sense circuit 108 reads the current that flows through that one of the memory cells 106a-106d. In one embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates a current or voltage pulse for heating the phase change material in the target memory cell. In one embodiment, write circuit 102 generates an appropriate current or voltage pulse, which is fed into distribution circuit 104 and distributed to the appropriate target memory cell 106a-106d. The current or voltage pulse amplitude and duration is controlled depending on whether the memory cell is being set or reset. Generally, a "set" operation of a memory cell is heating the phase change material of the target memory cell above its crystallization temperature (but below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

Figure 2:
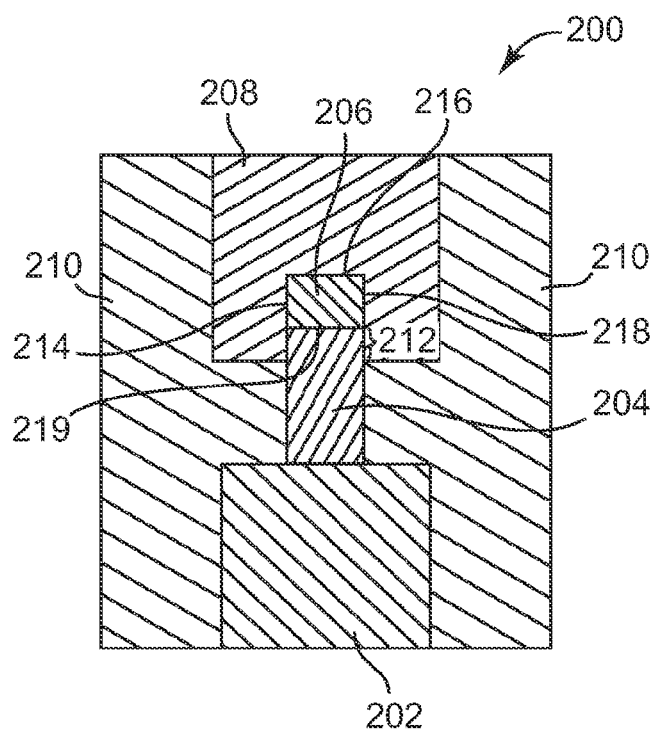
FIG. 2 illustrates a cross-sectional view of one embodiment of a phase change memory cell.

FIG. 2 illustrates a cross-sectional view of one embodiment of a phase change memory cell 200. In one embodiment, phase change memory cell 200 is a pillar phase change memory cell. Phase change memory cell 200 includes a first electrode 202, a phase change material storage location 204, an isolation material cap 206, a second electrode 208, and insulation material 210. Phase change material storage location 204 stores one or more bits of data. In one embodiment, phase change material storage location 204 includes a stack of two or more phase change material layers.

First electrode 202 contacts storage location 204, and storage location 204 contacts isolation material cap 206 and second electrode 208. In one embodiment, second electrode 208 includes an opening having a first sidewall 214, a second sidewall 218, and a surface 216 extending between first sidewall 214 and second sidewall 218. Isolation material cap 206 covers top surface 219 of storage location 204 and electrically isolates top surface 219 of storage location 204 from surface 216 of second electrode 208. Second electrode 208 laterally surrounds isolation material cap 206 and a portion of storage location 204 as indicated at 212. The height of portion 212 is based on a lithography-independent etching process that defines the interface area between storage location 204 and second electrode 208. Insulation material 210 laterally encloses first electrode 202, storage location 204, and second electrode 208. In one embodiment, each of the memory cells 106a-106d is similar to phase change memory cell 200.

Insulation material 210 can be any suitable insulator, such as $SiO_2$, $SiO_x$, SiN, fluorinated silica glass (FSG), boro-phosphorous silicate glass (BPSG), boro-silicate glass (BSG), or low-k material. Isolation material cap 206 can be any suitable dielectric material, such as SiN, SiON, AlN, $TiO_2$, $Al_2O_3$, $SiO_2$, a low-k material, porous $SiO_2$, aerogel, or xerogel. In one embodiment, isolation material cap 206 and insulation material 210 include the same material. In other embodiments, isolation material cap 206 has a lower thermal conductivity than insulation material 210. First electrode 202 and second electrode 208 can be any suitable electrode material, such as TiN, TaN, W, Al, TiSiN, TiAlN, TaSiN, TaAlN, WN, or Cu.

Phase change material storage location 204 may be made up of a variety of materials in accordance with the present invention. Generally, chalcogenide alloys that contain one or more elements from group VI of the periodic table are useful as such materials. In one embodiment, phase change material storage location 204 of memory cell 200 is made up of a chalcogenide compound material, such as GeSbTe, SbTe, GeTe, or AgInSbTe. In another embodiment, phase change material storage location 204 is chalcogen free, such as GeSb, GaSb, InSb, or GeGaInSb. In other embodiments, phase change material storage location 204 is made up of any suitable material including one or more of the elements Ge, Sb, Te, Ga, As, In, Se, and S.

A selection device such as an active device like a transistor or diode, is electrically coupled to first electrode 202 or second electrode 208 to control the application of current or voltage pulses to the other of first electrode 202 or second electrode 208, and thus to phase change material storage location 204, to set and reset the phase change material. The current path through phase change memory cell 200 includes the interface area at 212 between storage location 204 and second electrode 208. The height of the interface area at 212 defines the current density through the interface and thus the power used to program the memory cell. By reducing the height of the interface area at 212, the current density is increased, thus reducing the power used to program the memory cell.

During operation of phase change memory cell 200, current or voltage pulses are applied between first electrode 202 and second electrode 208 to program phase change memory cell 200. During a set operation of phase change memory cell 200, a set current or voltage pulse is selectively enabled to first electrode 202 and sent through phase change material storage location 204 thereby heating the phase change material above its crystallization temperature (but usually below its melting temperature). In this way, the phase change material reaches a crystalline state or a partially crystalline and partially amorphous state during the set operation. During a reset operation of phase change memory cell 200, a reset current or voltage pulse is selectively enabled to first electrode 202 and sent through phase change material storage location 204. The reset current or voltage quickly heats the phase change material above its melting temperature. After the current or voltage pulse is turned off, the phase change material quickly quench cools into an amorphous state or a partially amorphous and partially crystalline state.

Figure 3:
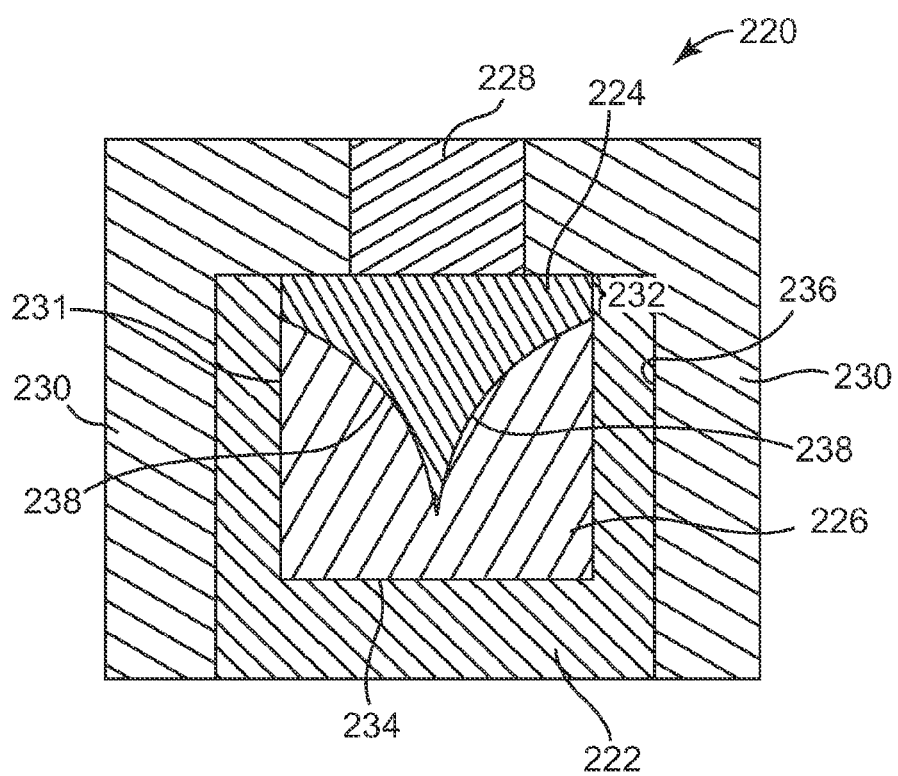
FIG. 3 illustrates a cross-sectional view of another embodiment of a phase change memory cell.

FIG. 3 illustrates a cross-sectional view of another embodiment of a phase change memory cell 220. In one embodiment, phase change memory cell 220 is a via phase change memory cell. Phase change memory cell 220 includes a first electrode 222, isolation material 226, a phase change material storage location 224, a second electrode 228, and insulation material 230. Phase change material storage location 224 stores one or more bits of data. In one embodiment, phase change material storage location 224 includes a stack of two or more phase change material layers. In another embodiment, two or more phase change materials are arranged cylindrically with at least one cylinder of a first phase change material surrounding a cylinder of a second phase change material.

First electrode 222 contacts isolation material 226 and storage location 224, and storage location 224 contacts second electrode 228. In one embodiment, first electrode 222 includes an opening having a first sidewall 231, a second sidewall 236, and a surface 234 extending between first sidewall 231 and second sidewall 236. Isolation material 226 covers surface 234 of first electrode 222 and electrically isolates the bottom surface 238 of storage location 224 from first electrode 222. First electrode 222 laterally surrounds isolation material 226 and storage location 224. First electrode 222 contacts a portion of storage location 224 as indicated at 232. The height of portion 232 is based on a lithography-independent etching process that defines the interface area between storage location 224 and first electrode 222. Insulation material 230 laterally encloses first electrode 222 and second electrode 228. In one embodiment, each of the memory cells 106a-106d is similar to phase change memory cell 220.

Insulation material 230 can be any suitable insulator, such as $SiO_2$, $SiO_x$, SiN, FSG, BPSG, BSG, or low-k material. Isolation material 226 can be any suitable dielectric material, such as SiN, SiON, AlN, $TiO_2$, $Al_2O_3$, $SiO_2$, a low-k material, porous $SiO_2$, aerogel, or xerogel. In one embodiment, isolation material 226 and insulation material 230 include the same material. In other embodiments, isolation material 226 has a lower thermal conductivity than insulation material 230. First electrode 222 and second electrode 228 can be any suitable electrode material, such as TiN, TaN, W, Al, TiSiN, TiAlN, TaSiN, TaAlN, WN, or Cu.

Phase change material storage location 224 may be made up of a variety of materials in accordance with the present invention. Generally, chalcogenide alloys that contain one or more elements from group VI of the periodic table are useful as such materials. In one embodiment, phase change material storage location 224 of memory cell 220 is made up of a chalcogenide compound material, such as GeSbTe, SbTe, GeTe, or AgInSbTe. In another embodiment, phase change material storage location 224 is chalcogen free, such as GeSb, GaSb, InSb, or GeGaInSb. In other embodiments, phase change material storage location 224 is made up of any suitable material including one or more of the elements Ge, Sb, Te, Ga, As, In, Se, and S.

A selection device such as an active device like a transistor or diode, is electrically coupled to first electrode 222 or second electrode 228 to control the application of current or voltage pulses to the other of first electrode 222 or second electrode 228, and thus to phase change material storage location 224, to set and reset the phase change material. The current path through phase change memory cell 220 includes the interface area at 232 between storage location 224 and first electrode 222. The height of the interface area at 232 defines the current density through the interface and thus the power used to program the memory cell. By reducing the height of the interface area at 232, the current density is increased, thus reducing the power used to program the memory cell.

During operation of phase change memory cell 220, current or voltage pulses are applied between first electrode 222 and second electrode 228 to program phase change memory cell 220. During a set operation of phase change memory cell 220, a set current or voltage pulse is selectively enabled to first electrode 222 and sent through phase change material storage location 224 thereby heating the phase change material above its crystallization temperature (but usually below its melting temperature). In this way, the phase change material reaches a crystalline state or a partially crystalline and partially amorphous state during the set operation. During a reset operation of phase change memory cell 220, a reset current or voltage pulse is selectively enabled to first electrode 222 and sent through phase change material storage location 224. The reset current or voltage quickly heats the phase change material above its melting temperature. After the current or voltage pulse is turned off, the phase change material quickly quench cools into an amorphous state or a partially amorphous and partially crystalline state.

The following FIGS. 4-10 illustrate embodiments of a method for fabricating a phase change memory cell, such as phase change memory cell 200 previously described and illustrated with reference to FIG. 2.

Figure 4:
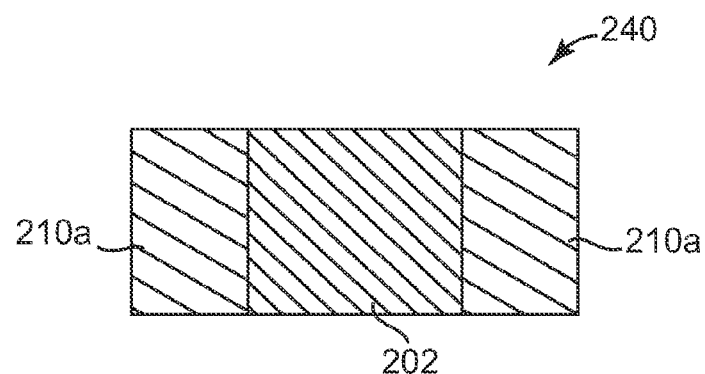
FIG. 4 illustrates a cross-sectional view of one embodiment of a preprocessed wafer.

FIG. 4 illustrates a cross-sectional view of one embodiment of a preprocessed wafer 240. Preprocessed wafer 240 includes first electrode 202, insulation material 210a, and lower wafer layers (not shown). In one embodiment, first electrode 202 is a contact plug, such as a W plug, Cu plug, TiN plug, TaN plug, Al plug, or other suitable conducting material plug. In another embodiment, first electrode 202 is a dedicated contact electrode comprising TiN, TaN, TiAlN, TiSiN, TaSiN, TaAlN, or other suitable material. First electrode 202 is laterally surrounded by insulation material 210a, such as $SiO_2$, $SiO_x$, SiN, FSG, BPSG, BSG, low-k material, or other suitable dielectric material, to electrically isolate first electrode 202 from adjacent device features.

Figure 5:
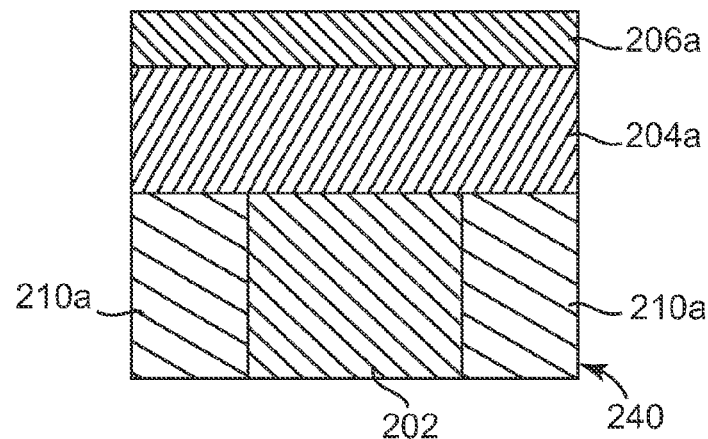
FIG. 5 illustrates a cross-sectional view of one embodiment of the preprocessed wafer, a phase change material layer, and an isolation material layer.

FIG. 5 illustrates a cross-sectional view of one embodiment of preprocessed wafer 240, a phase change material layer 204a, and an isolation material layer 206a. A phase change material, such as a chalcogenide compound material or other suitable phase change material, is deposited over preprocessed wafer 240 to provide phase change material layer 204a. Phase change material layer 204a is deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

An isolation material, such as SiN, SiON, AlN, $TiO_2$, $Al_2O_3$, $SiO_2$, a low-k material, porous $SiO_2$, aerogel, xerogel, or other suitable dielectric material, is deposited over phase change material layer 204a to provide isolation material layer 206a. Isolation material layer 206a is deposited using CVD, ALD, MOCVD, PVD, JVP, or other suitable deposition technique.

Figure 6:
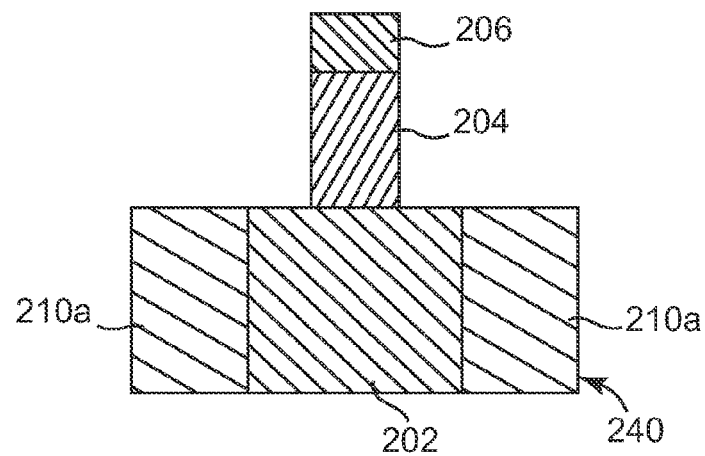
FIG. 6 illustrates a cross-sectional view of one embodiment of the preprocessed wafer, a storage location, and an isolation material cap after etching.

FIG. 6 illustrates a cross-sectional view of one embodiment of preprocessed wafer 240, a storage location 204, and an isolation material cap 206 after etching isolation material layer 206a and phase change material layer 204a. Isolation material layer 206a and phase change material layer 204a are etched to expose preprocessed wafer 240 and provide phase change material storage location 204 and isolation material cap 206. In one embodiment, storage location 204 and isolation material cap 206 form a pillar. In one embodiment, storage location 204 and isolation material cap 206 are substantially centered over first electrode 202.

Figure 7:
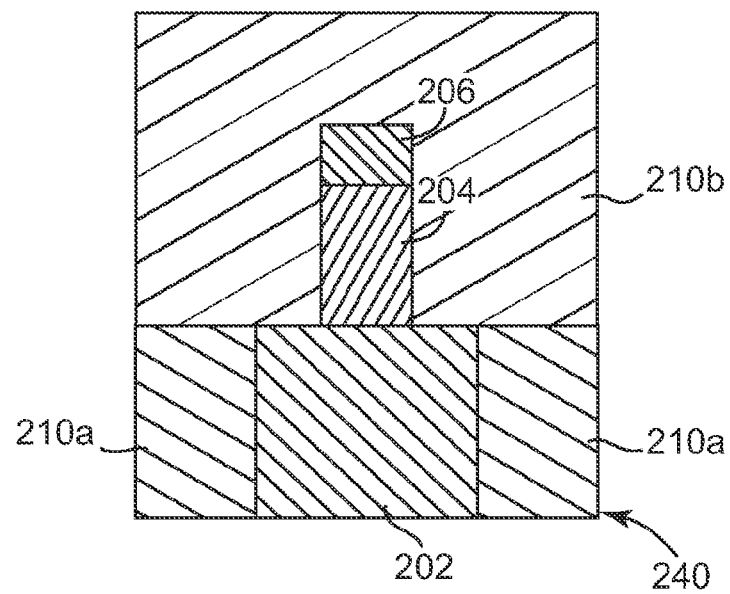
FIG. 7 illustrates a cross-sectional view of one embodiment of the preprocessed wafer, the storage location, the isolation material cap, and an insulation material layer.

FIG. 7 illustrates a cross-sectional view of one embodiment of preprocessed wafer 240, storage location 204, isolation material cap 206, and an insulation material layer 210b. An insulation material, such as $SiO_2$, $SiO_x$, SiN, FSG, BPSG, BSG, low-k material, or other suitable dielectric material, is deposited over exposed portions of isolation material cap 206, storage location 204, and preprocessed wafer 240 to provide an insulation material layer. The insulation material layer is deposited using CVD, ALD, MOCVD, PVD, JVP, or other suitable deposition technique. The insulation material layer is planarized to provide insulation material layer 210b having a level surface.

Figure 8:
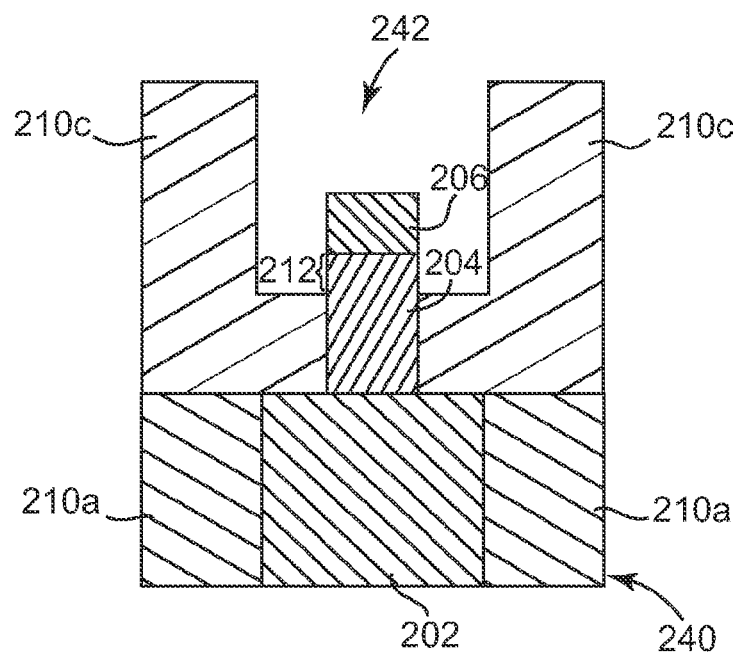
FIG. 8 illustrates a cross-sectional view of one embodiment of the preprocessed wafer, the storage location, the isolation material cap, and the insulation material layer after etching.

FIG. 8 illustrates a cross-sectional view of one embodiment of preprocessed wafer 240, storage location 204, isolation material cap 206, and insulation material layer 210c after etching insulation material layer 210b. Insulation material layer 210b is etched to provide opening 242 and insulation material layer 210c. Insulation material layer 210b is selectively etched to expose isolation material cap 206 and is over-etched to expose sidewall portions 212 of phase change material storage location 204. The depth of the over-etch is controlled to provide a desired interface area between phase change material storage location 204 and second electrode 208 yet to be fabricated.

An electrode material, such as TiN, TaN, W, Al, TiSiN, TiAlN, TaSiN, TaAlN, WN, or Cu, or other suitable electrode material, is deposited over exposed portions of insulation material layer 210c, isolation material cap 206, and phase change material storage location 204 to provide an electrode material layer. The electrode material layer is deposited using CVD, ALD, MOCVD, PVD, JVP, or other suitable deposition technique. The electrode material layer is planarized to expose insulation material layer 210c to provide second electrode 208 and phase change memory cell 200 as illustrated in FIG. 2.

Figure 9:
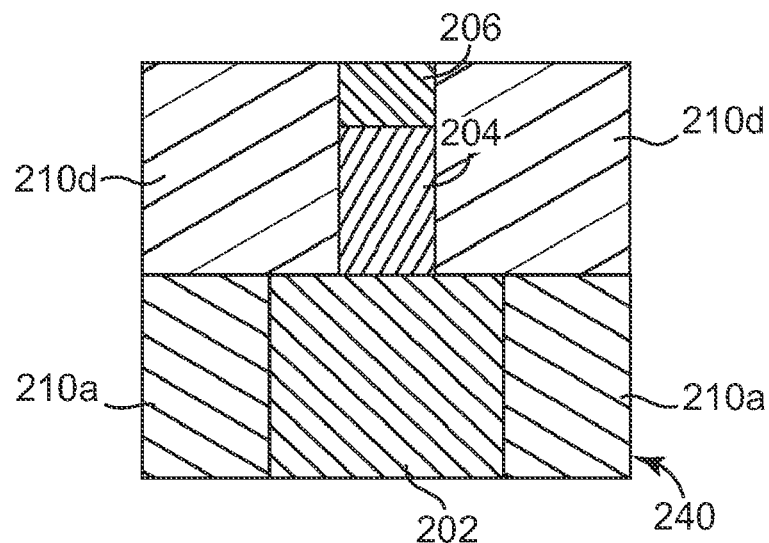
FIG. 9 illustrates a cross-sectional view of one embodiment of the preprocessed wafer, the storage location, the isolation material cap, and the insulation material layer after planarization.
Figure 10:
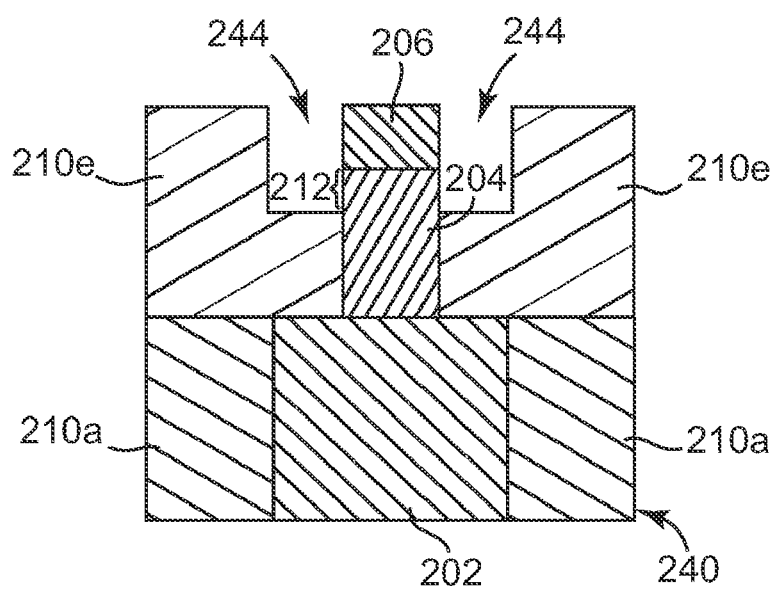
FIG. 10 illustrates a cross-sectional view of one embodiment of the preprocessed wafer, the storage location, the isolation material cap, and the insulation material layer after etching.

The following FIGS. 9 and 10 illustrate another embodiment for completing the fabrication of phase change memory cell 200 after the processing step illustrated in FIG. 7.

FIG. 9 illustrates a cross-sectional view of one embodiment of preprocessed wafer 240, storage location 204, isolation material cap 206, and insulation material layer 210d after planarizing insulation material layer 210b. Insulation material layer 210b is planarized to expose isolation material cap 206 to provide insulation material layer 210d.

FIG. 10 illustrates a cross-sectional view of one embodiment of preprocessed wafer 240, storage location 204, isolation material cap 206, and insulation material layer 210e after etching insulation material layer 210d. Insulation material layer 210d is etched to provide openings 244 and insulation material layer 210e. Insulation material layer 210d is selectively etched to expose the sidewalls of isolation material cap 206 and sidewall portions 212 of phase change material storage location 204. The depth of the etch is controlled to provide a desired interface area between phase change material storage location 204 and second electrode 208 yet to be fabricated.

An electrode material, such as TiN, TaN, W, Al, TiSiN, TiAlN, TaSiN, TaAlN, WN, or Cu, or other suitable electrode material, is deposited over exposed portions of insulation material layer 210e, isolation material cap 206, and phase change material storage location 204 to provide an electrode material layer. The electrode material layer is deposited using CVD, ALD, MOCVD, PVD, JVP, or other suitable deposition technique. The electrode material layer is planarized and etched to provide second electrode 208.

An insulation material, such as $SiO_2$, $SiO_x$, SiN, FSG, BPSG, BSG, low-k material, or other suitable dielectric material, is deposited over exposed portions of second electrode 208 and insulation material layer 210e to provide an insulation material layer. The insulation material layer is deposited using CVD, ALD, MOCVD, PVD, JVP, or other suitable deposition technique. The insulation material layer is planarized to expose second electrode 208 and provide phase change memory cell 200 as illustrated in FIG. 2.

The following FIGS. 11-16 illustrate embodiments of a method for fabricating a phase change memory cell, such as phase change memory cell 220 previously described and illustrated with reference to FIG. 3.

Figure 11:
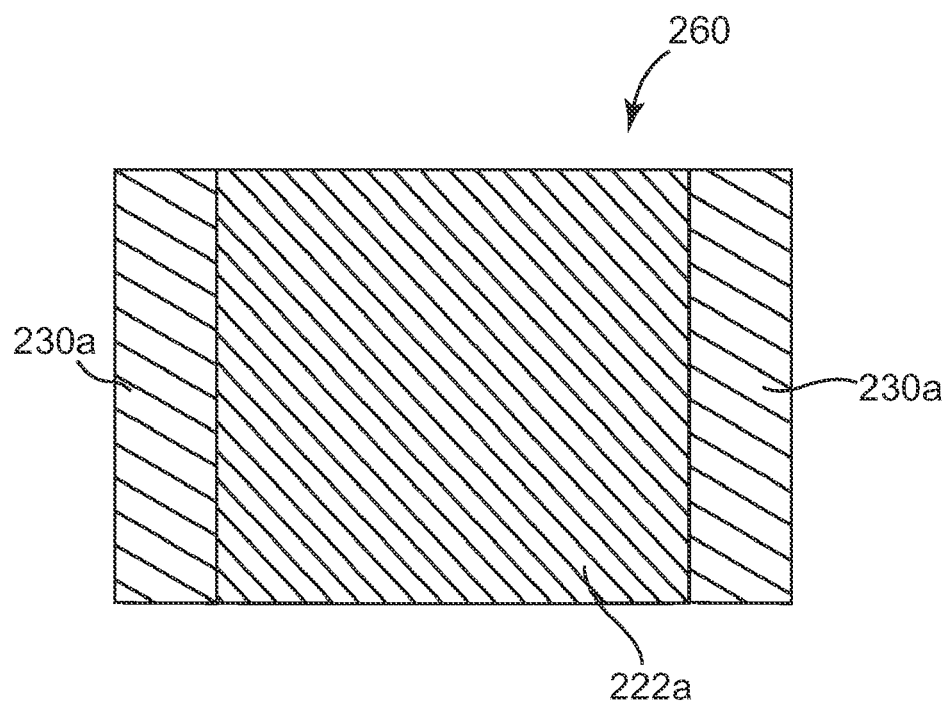
FIG. 11 illustrates a cross-sectional view of another embodiment of a preprocessed wafer.

FIG. 11 illustrates a cross-sectional view of another embodiment of a preprocessed wafer 260. Preprocessed wafer 260 includes first electrode 222a, insulation material 230a, and lower wafer layers (not shown). In one embodiment, first electrode 222a is a contact plug, such as a W plug, Cu plug, TiN plug, TaN plug, Al plug, or other suitable conducting material plug. In another embodiment, first electrode 222a is a dedicated contact electrode comprising TiN, TaN, TiAlN, TiSiN, TaSiN, TaAlN, or other suitable material. First electrode 222a is laterally surrounded by insulation material 230a, such as $SiO_2$, $SiO_x$, SiN, FSG, BPSG, BSG, low-k material, or other suitable dielectric material, to electrically isolate first electrode 222a from adjacent device features.

Figure 12:
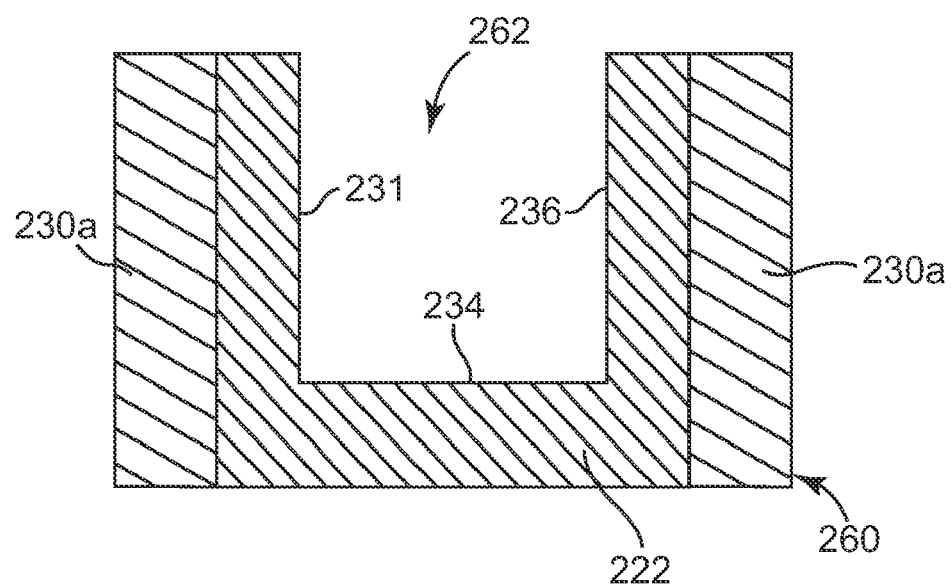
FIG. 12 illustrates a cross-sectional view of one embodiment of the preprocessed wafer after etching.

FIG. 12 illustrates a cross-sectional view of one embodiment of preprocessed wafer 260 after etching first electrode 222a. First electrode 222a is etched to provide opening 262 and first electrode 222. In one embodiment, opening 262 is cylindrical in shape. In one embodiment, opening 262 is substantially centered within first electrode 222. Opening 262 includes first sidewall 231, second sidewall 236, and surface 234 extending between first sidewall 231 and second sidewall 236.

Figure 13:
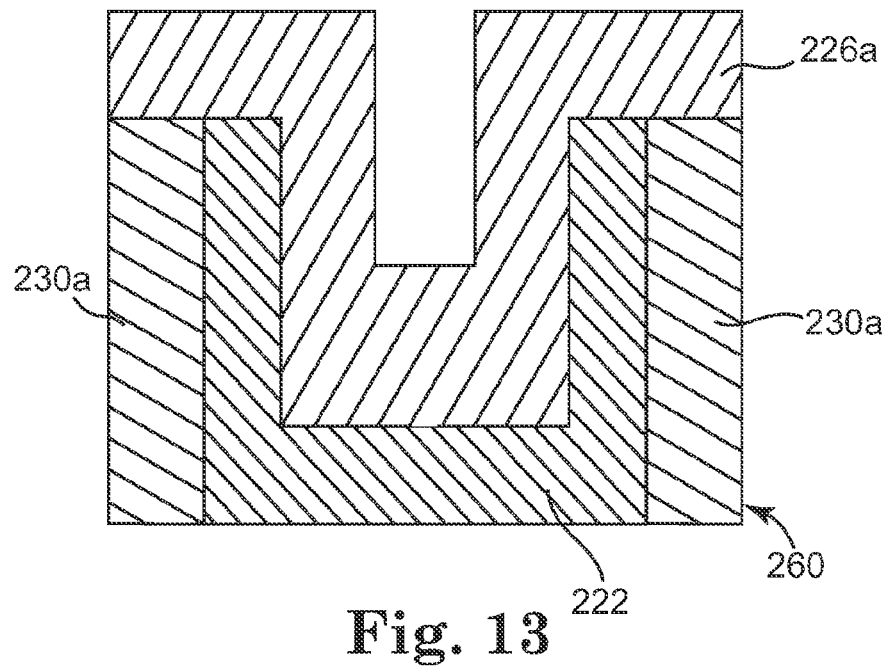
FIG. 13 illustrates a cross-sectional view of one embodiment of the preprocessed wafer and an isolation material layer.

FIG. 13 illustrates a cross-sectional view of one embodiment of preprocessed wafer 260 and an isolation material layer 226a. An isolation material, such as SiN, SiON, AlN, $TiO_2$, $Al_2O_3$, $SiO_2$, a low-k material, porous $SiO_2$, aerogel, xerogel, or other suitable dielectric material, is conformally deposited over preprocessed wafer 260 and into opening 262 to provide isolation material layer 226a. Isolation material layer 226a is deposited using CVD, ALD, MOCVD, PVD, JVP, or other suitable deposition technique.

Figure 14:
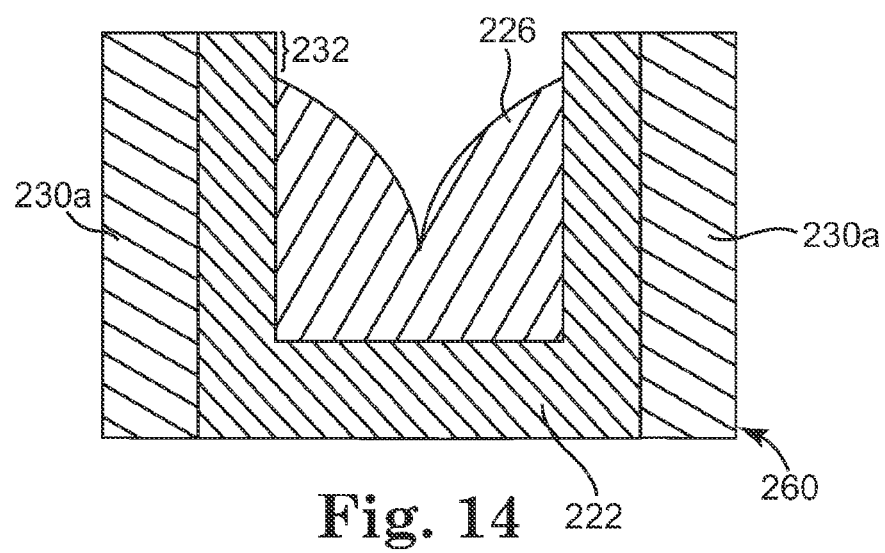
FIG. 14 illustrates a cross-sectional view of one embodiment of the preprocessed wafer and the isolation material layer after etching.

FIG. 14 illustrates a cross-sectional view of one embodiment of preprocessed wafer 260 and isolation material layer 226 after etching isolation material layer 226a. Isolation material layer 226a is etched using a spacer etch to expose sidewall portions 232 of first electrode 222. The depth of the spacer etch is controlled to provide a desired interface area between first electrode 222 and storage location 224 yet to be fabricated.

Figure 15:
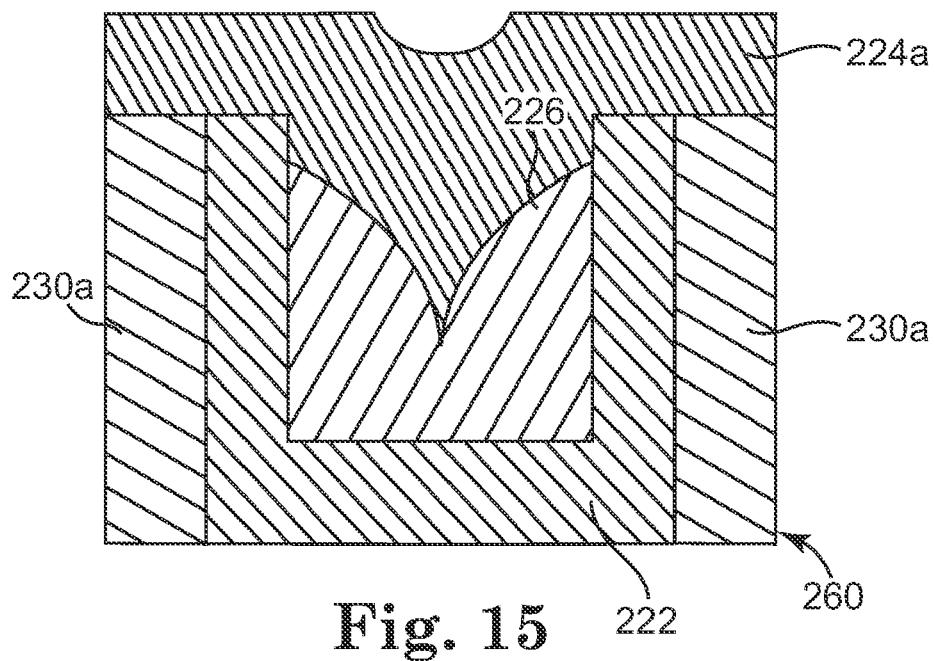
FIG. 15 illustrates a cross-sectional view of one embodiment of the preprocessed wafer, the isolation material layer, and a phase change material layer.

FIG. 15 illustrates a cross-sectional view of one embodiment of preprocessed wafer 260, isolation material layer 226, and a phase change material layer 224a. A phase change material, such as a chalcogenide compound material or other suitable phase change material, is deposited over exposed portions of preprocessed wafer 260 and isolation material 226 to provide phase change material layer 224a. Phase change material layer 224a is deposited using CVD, ALD, MOCVD, PVD, JVP, or other suitable deposition technique.

Figure 16:
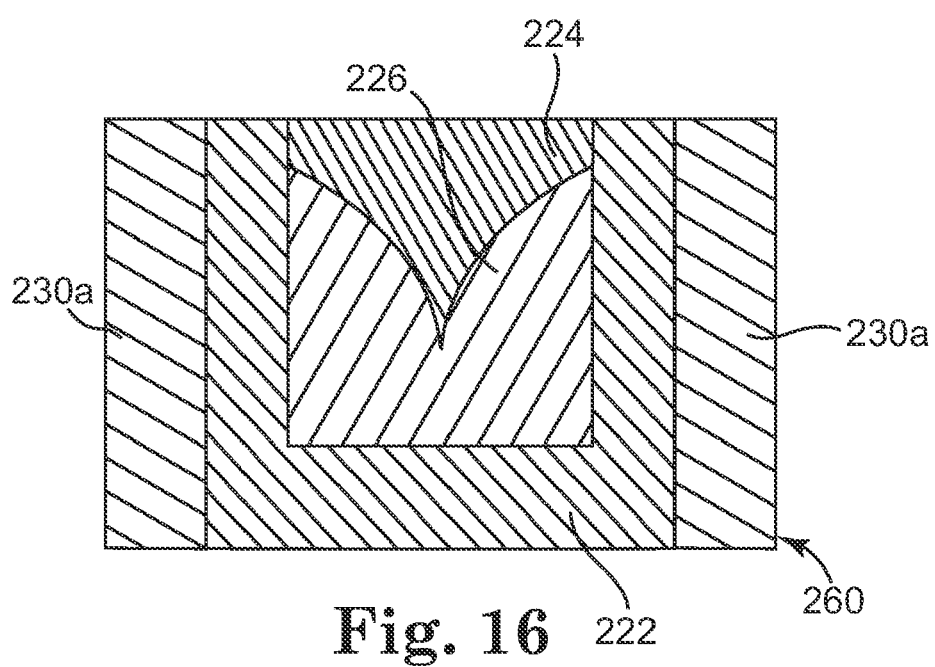
FIG. 16 illustrates a cross-sectional view of one embodiment of the preprocessed wafer, the isolation material layer, and a storage location after planarization.

FIG. 16 illustrates a cross-sectional view of one embodiment of preprocessed wafer 260, isolation material layer 226, and a phase change material storage location 224 after planarizing phase change material layer 224a. Phase change material layer 224a is planarized to expose first electrode 222 and provide storage location 224. Second electrode 228 is then fabricated over storage location 224.

In one embodiment, an electrode material, such as TiN, TaN, W, Al, TiSiN, TiAlN, TaSiN, TaAlN, WN, or Cu, or other suitable electrode material, is deposited over exposed portions of preprocessed wafer 260 and phase change material storage location 224 to provide an electrode material layer. The electrode material layer is deposited using CVD, ALD, MOCVD, PVD, JVP, or other suitable deposition technique. The electrode material layer is etched to provide second electrode 228. An insulation material, such as $SiO_2$, $SiO_x$, SiN, FSG, BPSG, BSG, low-k material, or other suitable dielectric material, is deposited over exposed portions of second electrode 228, storage location 224, and preprocessed wafer 260 to provide an insulation material layer. The insulation material layer is deposited using CVD, ALD, MOCVD, PVD, JVP, or other suitable deposition technique. The insulation material layer is planarized to expose second electrode 228 to provide phase change memory cell 220 as illustrated in FIG. 3.

In another embodiment, an insulation material, such as $SiO_2$, $SiO_x$, SiN, FSG, BPSG, BSG, low-k material, or other suitable dielectric material, is deposited over exposed portions of storage location 224 and preprocessed wafer 260 to provide an insulation material layer. The insulation material layer is deposited using CVD, ALD, MOCVD, PVD, JVP, or other suitable deposition technique. The insulation material layer is etched to provide an opening to expose storage location 224. An electrode material, such as TiN, TaN, W, Al, TiSiN, TiAlN, TaSiN, TaAlN, WN, or Cu, or other suitable electrode material, is deposited over exposed portions of the insulation material layer and storage location 224 to provide an electrode material layer. The electrode material layer is deposited using CVD, ALD, MOCVD, PVD, JVP, or other suitable deposition technique. The electrode material layer is planarized to expose the insulation material layer to provide second electrode 228 and phase change memory cell 220 as illustrated in FIG. 3.

Embodiments of the present invention provide a phase change memory cell having a phase change material and electrode interface defined by a lithography-independent etching process. The etching process is controlled to provide the desired interface area. By reducing the interface area, the current density through the phase change material at the interface is increased, thus the power used to program the phase change memory cell is reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell comprising:
   a first electrode;
   a second electrode forming an opening, the opening defined by a first sidewall, a second sidewall, and a surface extending between the first sidewall and the second sidewall;
   phase change material contacting the first electrode and the first sidewall and the second sidewall; and
   isolation material electrically isolating the phase change material from the surface extending between the first sidewall and the second sidewall.

2. The memory cell of claim 1, wherein the memory cell comprises a pillar memory cell.

3. The memory cell of claim 1, wherein the memory cell comprises a via memory cell.

4. The memory cell of claim 1, further comprising:
   insulation material laterally enclosing the first electrode and the second electrode.

5. The memory cell of claim 4, wherein the isolation material has a lower thermal conductivity than the insulation material.

6. The memory cell of claim 1, wherein the phase change material comprises at least one of Ge, Sb, Te, Ga, As, In, Se, and S.

7. A memory cell comprising:
   a first electrode;
   phase change material contacting the first electrode, the phase change material defining a top surface and a sidewall;
   isolation material contacting the top surface of the phase change material; and
   a second electrode contacting the isolation material and a portion of the sidewall of the phase change material,
   wherein the isolation material electrically isolates the top surface of the phase change material from the second electrode.

8. The memory cell of claim 7, further comprising:
   insulation material laterally enclosing the first electrode, the second electrode, and the phase change material.

9. The memory cell of claim 8, wherein the isolation material has a lower thermal conductivity than the insulation material.

10. The memory cell of claim 7, wherein the isolation material comprises a nitride.

11. The memory cell of claim 7, wherein the phase change material comprises at least one of Ge, Sb, Te, Ga, As, In, Se, and S.

12. A memory cell comprising:
    a first electrode defining an opening having a first sidewall, a second sidewall, and a surface extending between the first sidewall and the second sidewall;
    phase change material contacting a portion of the first sidewall and a portion of the second sidewall;
    isolation material electrically isolating the phase change material from the surface extending between the first sidewall and the second sidewall; and
    a second electrode contacting the phase change material.

13. The memory cell of claim 12, further comprising:
    insulation material laterally enclosing the first electrode and the second electrode.

14. The memory cell of claim 13, wherein the isolation material has a lower thermal conductivity than the insulation material.

15. The memory cell of claim 12, wherein the isolation material comprises a nitride.

16. The memory cell of claim 12, wherein the phase change material comprises at least one of Ge, Sb, Te, Ga, As, In, Se, and S.

17. A method for fabricating a memory cell, the method comprising:
    providing a preprocessed wafer including a first electrode;
    depositing a phase change material layer over the preprocessed wafer;
    depositing an isolation material layer over the phase change material layer;
    etching the isolation material layer and the phase change material layer to form a storage location contacting an isolation material cap, the storage location contacting the first electrode;
    depositing insulation material over exposed portions of the isolation material cap, the storage location, and the preprocessed wafer;
    etching the insulation material to expose the isolation material cap and a portion of a sidewall of the storage location; and
    fabricating a second electrode contacting the exposed sidewall portion of the storage location.

18. The memory cell of claim 17, further comprising:
    planarizing the insulation material layer to expose the isolation material.

19. The memory cell of claim 17, wherein depositing the isolation material layer comprises depositing a nitride.

20. The memory cell of claim 17, wherein depositing the phase change material layer comprises depositing at least one of Ge, Sb, Te, Ga, As, In, Se, and S.

21. The memory cell of claim 17, wherein etching the isolation material layer and the phase change material layer comprises etching the isolation material layer and the phase change material layer to form a pillar.

22. A method for fabricating a memory cell, the method comprising:
    providing a preprocessed wafer including a first electrode;
    etching the first electrode to form an opening in the first electrode;
    conformally depositing an isolation material over the preprocessed wafer and in the opening;
    etching the isolation material to expose a portion of a sidewall of the opening;
    depositing phase change material over exposed portions of the preprocessed wafer, the isolation material, and in the opening;
    planarizing the phase change material to expose the first electrode; and
    fabricating a second electrode contacting the phase change material.

23. The memory cell of claim 22, wherein depositing the isolation material comprises depositing a nitride.

24. The memory cell of claim 22, wherein depositing the phase change material comprises depositing at least one of Ge, Sb, Te, Ga, As, In, Se, and S.

25. The memory cell of claim 22, wherein etching the first electrode comprises etching the first electrode to form a cylindrical opening in the first electrode.

* * * * *